US011583962B2

(12) United States Patent
Nakamura

(10) Patent No.: US 11,583,962 B2
(45) Date of Patent: Feb. 21, 2023

(54) HOLDING TABLE MANUFACTURING METHOD

(71) Applicant: DISCO CORPORATION, Tokyo (JP)

(72) Inventor: Masaru Nakamura, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 17/455,484

(22) Filed: Nov. 18, 2021

(65) Prior Publication Data

US 2022/0184754 A1    Jun. 16, 2022

(30) Foreign Application Priority Data

Dec. 16, 2020 (JP) .............................. JP2020-208729

(51) Int. Cl.
| | |
|---|---|
| *B23P 15/00* | (2006.01) |
| *B23K 26/364* | (2014.01) |
| *B24B 41/06* | (2012.01) |
| *H01L 21/67* | (2006.01) |
| *H01L 21/683* | (2006.01) |

(52) U.S. Cl.
CPC ............ *B23P 15/00* (2013.01); *B23K 26/364* (2015.10); *B24B 41/068* (2013.01); *H01L 21/67092* (2013.01); *H01L 21/6838* (2013.01)

(58) Field of Classification Search
CPC ... H01L 21/683; H01L 21/6838; B24B 41/06; B24B 41/061
See application file for complete search history.

(56) References Cited

U.S. PATENT DOCUMENTS

| | | | | | |
|---|---|---|---|---|---|
| 4,521,995 | A | * | 6/1985 | Sekiya | .................. H01L 21/302 |
| | | | | | 125/35 |
| 7,654,887 | B2 | * | 2/2010 | Ishikawa | ................. B24B 37/30 |
| | | | | | 451/388 |
| 9,347,988 | B2 | * | 5/2016 | Akiyama | ........... G01R 31/2886 |

(Continued)

FOREIGN PATENT DOCUMENTS

| | | |
|---|---|---|
| JP | 2002200545 A | 7/2002 |
| JP | 2003094741 A * | 4/2003 |

(Continued)

OTHER PUBLICATIONS

JP-6489970-B2 machine translation of the description (Year: 2019).*

(Continued)

*Primary Examiner* — Michael W Hotchkiss
(74) *Attorney, Agent, or Firm* — Greer Burns & Crain Ltd.

(57) ABSTRACT

A holding table manufacturing method includes forming a plurality of first grooves in a front surface of a plate-shaped body, forming a plurality of second grooves in a back surface of the plate-shaped body, laying, on one another, a plurality of the plate-shaped bodies formed respectively with a plurality of the first grooves and a plurality of the second grooves and uniting the plate-shaped bodies together to form a suction plate, and accommodating the suction plate in an accommodating recess of a frame body to form a holding table. The first grooves and the second grooves do not reach side surfaces of the plate-shaped body, the first grooves and the second grooves communicate with each other, and the thickness of the suction plate is larger than the depth of the accommodating recess.

7 Claims, 12 Drawing Sheets

(56) References Cited

U.S. PATENT DOCUMENTS

| | | | | |
|---|---|---|---|---|
| 10,279,452 B2 * | 5/2019 | Yamanaka | ................ | B24B 7/22 |
| 11,315,822 B2 * | 4/2022 | Yamamoto | ............ | B25B 11/005 |
| 2006/0203222 A1 * | 9/2006 | Ohmiya | ................. | G03F 7/707 |
| | | | | 355/75 |

FOREIGN PATENT DOCUMENTS

| | | | | | |
|---|---|---|---|---|---|
| JP | 2004356357 | A | | 12/2004 | |
| JP | 2011009423 | A | * | 1/2011 | |
| JP | 2011009424 | A | | 1/2011 | |
| JP | 2014150219 | A | * | 8/2014 | ............. B23K 26/08 |
| JP | 2015199153 | A | * | 11/2015 | |
| JP | 6489970 | B2 | * | 3/2019 | |

OTHER PUBLICATIONS

JP-2011009423-A machine translation of the description (Year: 2011).*
JP-2014150219-A machine translation of the description (Year: 2014).*
JP-2015199153-A machine translation of the description (Year: 2015).*
JP-2003094741-A machine translation of the description (Year: 2003).*

* cited by examiner

HOLDING TABLE MANUFACTURING METHOD

BACKGROUND OF THE INVENTION

Field of the Invention

The present invention relates to a holding table manufacturing method for manufacturing a holding table that holds a plate-shaped workpiece in a processing apparatus.

Description of the Related Art

When forming device chips to be mounted on electronic apparatuses, first, devices such as an integrated circuit (IC) and a large scale integration (LSI) circuit are formed on a front surface of a disk-shaped semiconductor wafer. In this instance, a plurality of the devices are arranged on the front surface of the semiconductor wafer in a matrix pattern. Then, the semiconductor wafer is ground and thinned from the back surface side, and the semiconductor wafer is divided on a device basis to form device chips. Grinding of the semiconductor wafer is conducted by a grinding apparatus (see, for example, Japanese Patent Laid-open No. 2002-200545). The grinding apparatus includes a holding table that holds the workpiece such as the semiconductor wafer under suction, and a grinding unit that grinds the workpiece held by the holding table under suction. The grinding unit includes an annular grinding wheel at a lower end. Onto a lower surface of the grinding wheel that faces an upper surface of the holding table, grindstones arranged in an annular pattern are mounted.

The holding table includes a porous member having a plan shape substantially equal to that of the workpiece, and a frame body provided at an upper portion with an accommodating recess for accommodating the porous member. Inside the frame body, a suction passage having one end reaching a bottom surface of the accommodating recess and having the other end reaching the exterior of the frame body is provided. When the porous member is accommodated in the accommodating recess to expose the upper surface of the porous member, the workpiece is mounted on the porous member, and a suction source is connected to the other end side of the suction passage, a negative pressure acts on the workpiece through the suction passage and the porous member, and the workpiece is held under suction. When grinding the workpiece by the grinding apparatus, the grinding wheel is rotated to rotationally move the grindstones on an annular trajectory, and the grinding unit is lowered toward the holding table. As a result, bottom surfaces of the grindstones are brought into contact with a ground surface which is an upper surface of the workpiece, and the workpiece is ground. Here, in order to grind the workpiece with high accuracy, the upper surface of the porous member of the holding table and the bottom surfaces of the grindstones rotationally moved should be parallel to each other. In view of this, a step called self-grinding is carried out, in which the porous member is ground by the grindstones to adjust the shape of the porous member, before mounting the workpiece on the porous member.

However, for the workpiece formed from a material such as a semiconductor and for the porous member formed from a material such as a ceramic, the kind of the grindstones suitable for grinding differs. Therefore, when performing self-grinding, a grinding wheel including dedicated grindstones should be mounted to the grinding unit, and, after the self-grinding is finished, the grinding wheel should be replaced by a grinding wheel including grindstones suitable for the workpiece.

Here, a holding table in which the porous structure is formed from the same material as the workpiece has been known (see, for example, Japanese Patent Laid-open No. 2011-9424). In this case, since the grinding of the holding table and grinding of the workpiece can be performed with the same grindstones, replacement of the grinding wheel is not needed after the self-grinding is conducted, and grinding of the workpiece can be started directly after the self-grinding. It is to be noted, however, that a complicated process has been needed for manufacturing the holding table having this porous structure. In addition, there has been known a technology in which a suction plate formed from the same material as the workpiece is mounted on the porous member of the holding table, and the workpiece is held under suction through the suction plate and the porous member (see, for example, Japanese Patent Laid-open No. 2004-356357). Inside the suction plate, a suction passage communicating from a surface on one side to a surface on the other side is formed. However, when self-grinding is performed by the grinding apparatus, the upper surface of the suction plate is exposed, and the negative pressure leaks, so that it is not easy to hold the suction plate and it is difficult to suitably perform the self-grinding.

SUMMARY OF THE INVENTION

In view of this, it may be contemplated to accommodate the suction plate in the accommodating recess of the frame body in place of the porous member, to produce the holding table. However, the suction plate to be accommodated in the accommodating recess in which the porous member has been accommodated should have a thickness larger than the depth of the porous member. If not so, at the time of self-grinding of the holding table, the grindstones make contact with the frame body prior to making contact with the suction plate. In this case, replacement with the grinding wheel for self-grinding is necessary. On the other hand, if the suction plate is merely thickened, it becomes difficult to form the suction plate with a suction passage reaching from a surface on one side to a surface on the other side of the suction plate. For example, when cut grooves are formed in both surfaces of the suction plate by an annular cutting blade such that the cut grooves in both surfaces communicate with each other at their intersections, it is necessary to form deeper cut grooves when the suction plate becomes thicker. For forming the deep cut grooves, a cutting blade with a large cutting edge thickness should be used, and the width of the cut grooves formed is also increased. In this case, the workpiece cannot be suitably supported by the suction plate.

Accordingly, it is an object of the present invention to provide a holding table manufacturing method by which a holding table capable of efficient self-grinding by a grinding apparatus can be easily manufactured.

In accordance with an aspect of the present invention, there is provided a holding table manufacturing method including a first groove forming step of forming a plurality of first grooves in a front surface of a plate-shaped body along a first direction, a second groove forming step of inverting the plate-shaped body face side back and forming a plurality of second grooves in a back surface of the plate-shaped body along a second direction intersecting the first direction, a suction plate forming step of laying, on one another, a plurality of the plate-shaped bodies formed respectively with a plurality of the first grooves and a plurality of the second grooves and uniting a plurality of the plate-shaped bodies together to form a suction plate, and an accommodating step of accommodating the suction plate in an accommodating recess of a frame body formed with the accommodating recess in an upper surface to form a holding table, in which the first grooves and the second grooves do not reach side surfaces of the plate-shaped body, the sum of the depth of the first grooves and the depth of the second grooves is larger than the thickness of the plate-shaped body, and the first grooves and the second grooves communicate with each other at their intersections, and the thickness of the suction plate is larger than the depth of the accommodating recess.

Preferably, in the first groove forming step, a side of the front surface of the plate-shaped body is cut by an annular cutting blade to form the first grooves, and in the second groove forming step, a side of the back surface of the plate-shaped body is cut by the cutting blade to form the second grooves.

Alternatively, preferably, in the first groove forming step, a laser beam of such a wavelength as to be absorbed in the plate-shaped body is applied to the front surface side of the plate-shaped body to form the first grooves by ablation, and in the second groove forming step, the laser beam is applied to the back surface side of the plate-shaped body to form the second grooves by ablation.

In addition, preferably, in the accommodating step, the suction plate is fixed to the accommodating recess of the frame body with an adhesive.

Besides, preferably, the holding table manufacturing method further includes an etching step of etching the front surface side and the back surface side of a plurality of the plate-shaped bodies before the suction plate forming step.

In addition, preferably, the plate-shaped body is formed from the same material as a workpiece to be held by the holding table.

Besides, preferably, one of or both the interval of a plurality of the first grooves and the interval of a plurality of the second grooves become narrow as they are spaced farther from the center of the plate-shaped body.

In the holding table manufacturing method according to one mode of the present invention, the front surface and the back surface of a plate-shaped body are respectively formed with a plurality of grooves such as to intersect each other. Then, the plate-shaped bodies are laid on one another and united together to form a suction plate. In each plate-shaped body, the respective grooves in the front surface and the back surface are connected at their intersections. Therefore, the front surface and the back surface of each plate-shaped body communicate with each other, and the front surface and the back surface of the suction plate communicate with each other. Here, it is comparatively easy to form both surfaces of the plate-shaped bodies thinner than the suction plate with the grooves communicating with each other. Since the thickness of the suction plate can be adjusted by changing the number of the plate-shaped bodies constituting the suction plate, it is also possible to form a suction plate having a thickness exceeding the depth of the accommodating recess of the frame body. When the suction plate with such a thickness is formed and accommodated in the accommodating recess to manufacture the holding table, an upper portion of the suction plate is higher than an upper surface of the frame body. When this holding table is incorporated into a grinding apparatus and self-grinding is performed, only the suction plate can be ground while preventing the grindstones from making contact with the frame body.

Consequently, according to the present invention, there is provided a holding table manufacturing method by which a holding table capable of efficient self-grinding by a grinding apparatus can be easily manufactured.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
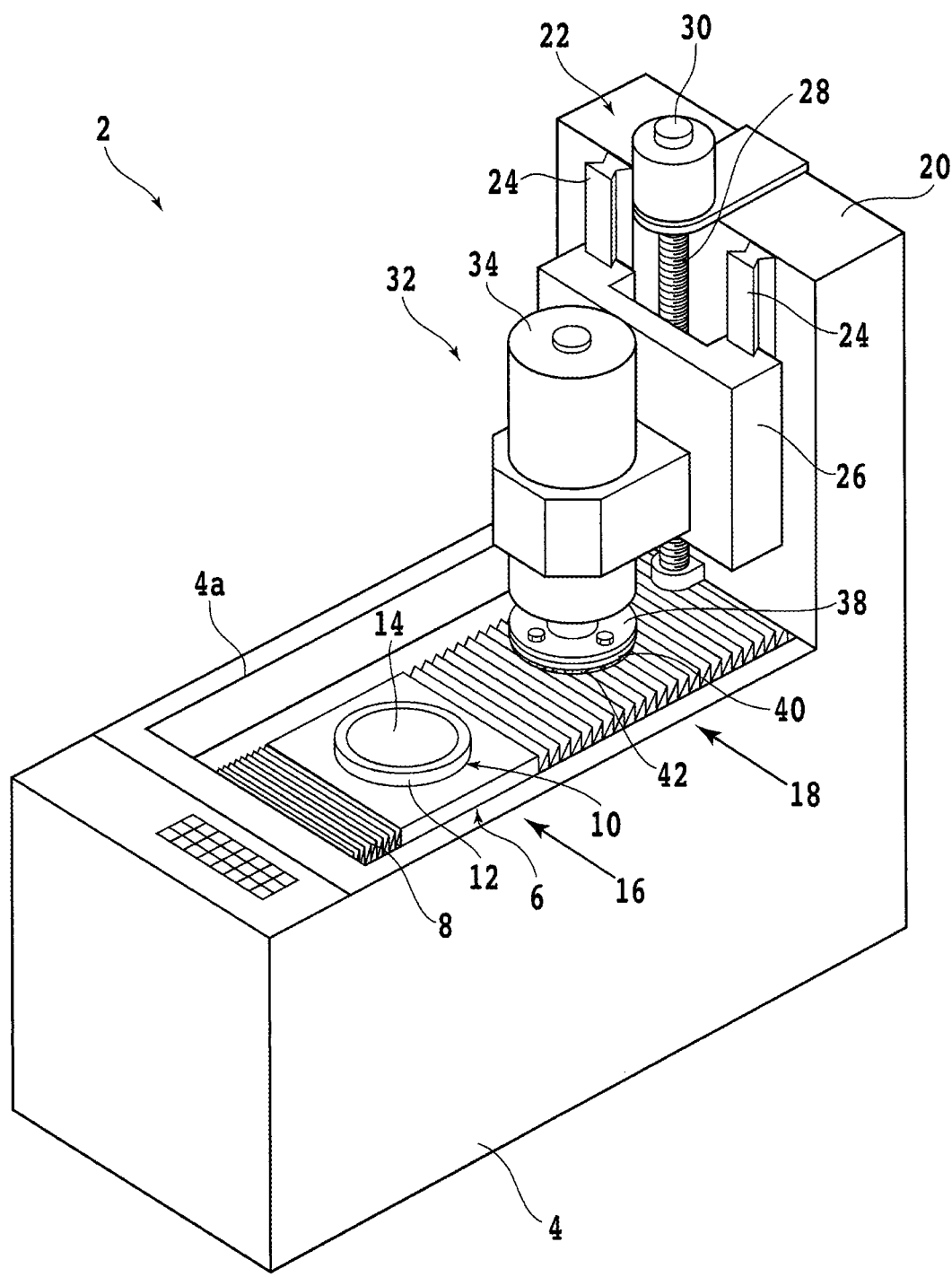
FIG. 1 is a perspective view schematically depicting a grinding apparatus.

An embodiment of the present invention will be described referring to the drawings. In a holding table manufacturing method according to the present embodiment, a holding table that can be used for holding a workpiece in a processing apparatus is manufactured. Particularly, the holding table can be preferably used for a grinding apparatus that grinds a workpiece. It is to be noted, however, that the use of the holding table is not limited to this, and the holding table may be used for other purposes.

First, a grinding apparatus for which the holding table manufactured by the holding table manufacturing method according to the present embodiment is used will be described. FIG. 1 is a perspective view schematically depicting a grinding apparatus 2. An upper surface of a base 4 that supports constituent elements of the grinding apparatus 2 is formed with an opening 4a. In the opening 4a, a moving table 6 on an upper surface of which a holding table 10 is to be mounted is provided. The moving table 6 is moved between a conveying-in/out region 16 where the workpiece is attached and detached on the holding table 10 and a processing region 18 where grinding of the workpiece is conducted. To both end parts of the moving table 6 in the moving direction of the moving table 6 moved between the conveying-in/out region 16 and the processing region 18, a bellows-like dustproof and dropletproof cover 8 contracted and extended attendant on the movement of the moving table 6 such as to cover the opening 4a is connected. On a lower side of the dustproof and dropletproof cover 8, a moving mechanism (not illustrated) for moving the moving table 6 in the moving direction is disposed.

The holding table 10 to be mounted on the moving table 6 has a suction plate 14 having a diameter corresponding to the diameter of the workpiece, and a frame body 12 formed in an upper surface thereof with an accommodating recess for accommodating the suction plate 14. An upper surface of the holding table 10 is a holding surface for holding the workpiece. The holding table 10 is provided therein with a suction passage (not illustrated in FIG. 1) communicating with the suction plate 14 at one end thereof and connected to a suction source (not illustrated) at the other end thereof. At the time of holding the workpiece by the holding table 10, the workpiece is mounted on the holding surface. Thereafter, when the suction source is operated, a negative pressure acts on the workpiece mounted on the holding surface, whereby the workpiece is held by the holding table 10 under suction. An upper end of a rotary shaft (not illustrated) along the direction perpendicular to the holding surface is assembled in the center of a bottom part of the holding table 10. A rotational drive source (not illustrated) is connected to a lower end of the rotary shaft, and, when the rotational drive source is operated, the holding table 10 is rotated around the rotary shaft perpendicular to the holding surface.

On an upper side of the processing region 18, a grinding unit 32 that grinds the workpiece is disposed. A support section 20 is erected at a rear end part of the base 4 of the grinding apparatus 2, and the grinding unit 32 is supported by the support section 20. At a front surface of the support section 20, a lifting unit 22 that lifts the grinding unit 32 upward and downward is disposed. The lifting unit 22 has a pair of guide rails 24 provided on a front surface of the support section 20 and extending in a vertical direction, and a moving plate 26 slidably attached to the guide rails 24. A nut section (not illustrated) is provided on a back surface side (rear surface side) of the moving plate 26, and a ball screw 28 parallel to the guide rails 24 is in screw engagement with the nut section. A pulse motor 30 is connected to one end part of the ball screw 28. When the ball screw 28 is rotated by the pulse motor 30, the moving plate 26 is moved in the vertical direction along the guide rails 24. The lifting unit 22 includes the guide rails 24, the moving plate 26, the ball screw 28, and the pulse motor 30. The grinding unit 32 is fixed to the front surface of the moving plate 26. When the lifting unit 22 is operated, the grinding unit 32 fixed to the moving plate 26 can be lifted upward and downward.

The grinding unit 32 includes a spindle 36 extending along the vertical direction, a spindle housing 34 covering an upper portion of the spindle 36, and a motor (not illustrated) connected to a base end side (upper end side) of the spindle 36. Further, a wheel mount 38 is disposed on a tip side (lower end side) of the spindle 36, and a grinding wheel 40 is fixed to a lower surface of the wheel mount 38. A plurality of grindstones 42 arranged in an annular pattern are mounted to a lower surface of the grinding wheel 40. The grindstones 42 include, for example, a bond material including a resin or the like, and abrasive grains of diamond or the like dispersed and fixed in the bond material. When the motor is operated to rotate the spindle 36, the grindstones 42 are moved on an annular trajectory. When the grinding unit 32 is lowered in a state in which the spindle 36 is rotated and the grindstones 42 are brought into contact with an upper surface of the workpiece held by the holding table 10, the workpiece is ground and thinned.

In the grinding apparatus 2, for grinding the workpiece with high accuracy, it is necessary for the holding surface of the holding table 10 and bottom surfaces of the grindstones 42 rotated and moved be parallel to each other. In view of this, before the workpiece is placed on the holding table 10, a step called self-grinding in which the holding surface of the holding table 10 is ground by the grindstones 42 to adjust the shape is carried out. Here, when the suction plate 14 of the holding table 10 is formed from the same material as the workpiece, the self-grinding and the grinding of the workpiece can be carried out with the same grindstones 42.

The workpiece to be ground by the grinding apparatus 2 is, for example, a substantially disk-shaped substrate formed from a material such as silicon (Si), silicon carbide (SiC), gallium nitride (GaN), gallium arsenide (GaAs), or other semiconductor. Alternatively, the workpiece is, for example, a substrate formed from a material such as sapphire, glass, or quartz. On the front surface of the workpiece, a plurality of devices such as ICs or LSI circuits are formed in the state of being arranged in matrix. When the workpiece is thinned by grinding from the back surface side and thereafter divided on a device basis, individual device chips are obtained. The device chips are used by being mounted on electronic apparatuses such as mobile phones and personal computers.

Note that it is not necessary for the suction plate 14 of the holding table 10 to be formed from strictly the same material as the workpiece. When the material of the suction plate 14 is comparable to the workpiece in being easy to grind by the grindstones 42, the replacement of the grinding wheel 40 before and after the self-grinding is not necessary. Therefore, the material of the suction plate 14 is not limited to the material of the workpiece.

Figure 2:
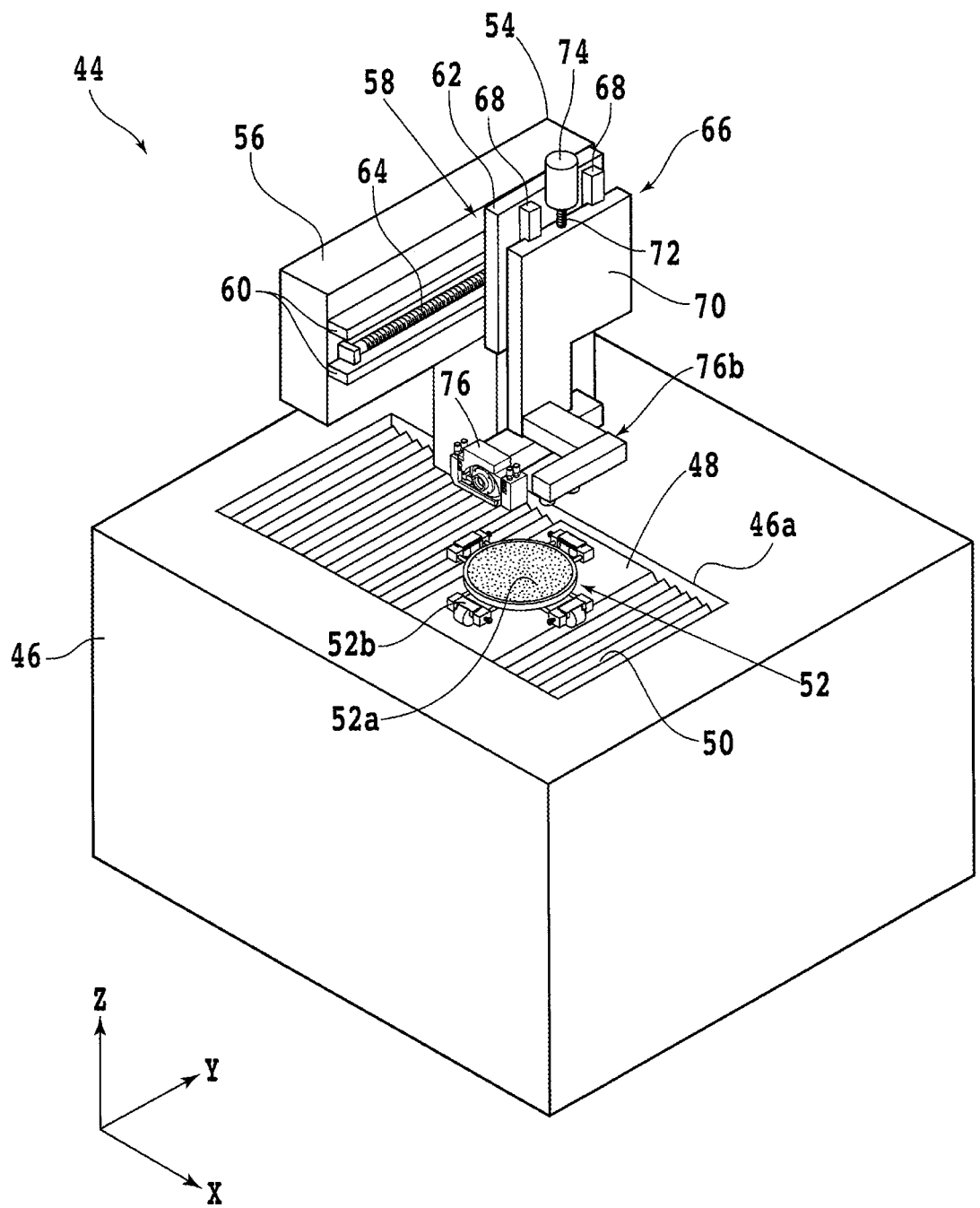
FIG. 2 is a perspective view schematically depicting a cutting apparatus.

Next, a cutting apparatus to be used in the holding table manufacturing method according to the present embodiment will be described. FIG. 2 is a perspective view schematically depicting a cutting apparatus 44. The cutting apparatus 44 includes a base 46 that supports the constituent elements. An upper surface of the base 46 is formed with a rectangular opening 46a such that the longitudinal direction thereof is along an X-axis direction (processing feeding direction). In the opening 46a, a moving table 48 and a bellows-like dustproof and dropletproof cover 50 contracted and extended attendant on the movement of the moving table 48 are connected. On a lower side of the dustproof and dropletproof cover 50, a moving mechanism (processing feeding unit) (not illustrated) that moves the moving table 48 in the X-axis direction is disposed.

On an upper surface of the moving table 48, a holding table 52 is disposed. The holding table 52 has a function of holding the workpiece mounted on a porous member 52a exposed on the upper side under suction. An upper surface of the porous member 52a is a holding surface that holds the workpiece. The holding table 52 includes a plurality of clamps 52b in the periphery of the holding surface. As will be described later using FIG. 3, the clamps 52b have a function of gripping an annular frame 7 constituting a frame unit 11 including a plate-shaped body 1 serving as the workpiece. The holding table 52 is formed therein with a suction passage (not illustrated) having one end connected to a suction source (not illustrated) such as an ejector provided in the exterior of the holding table 52. The other end of the suction passage reaches the porous member 52a. When the workpiece is placed on the holding surface and the suction source is operated, the holding table 52 can hold the workpiece under suction. The holding table 52 is connected to a rotational drive source (not illustrated) such as a motor, and is rotated around a rotational axis which is substantially parallel to a Z-axis direction (vertical direction).

On an upper side of the holding table 52, a cutting unit 76 is disposed. On an upper surface of the base 46, a support structure 54 for supporting the cutting unit 76 is disposed. The support structure 54 is provided at an upper portion with an arm section 56 extending on an upper side of the opening 46a such as to bridge over the opening 46a. At a front upper part of the support structure 54, an indexing feeding unit 58 that moves the cutting unit 76 in a Y-axis direction (indexing feeding direction) is provided. The indexing feeding unit 58 includes a pair of Y-axis guide rails 60 extending on a front surface of the support structure 54 along the Y-axis direction. A Y-axis moving plate 62 is slidably mounted to the pair of Y-axis guide rails 60. A nut section (not illustrated) is provided on a back surface side (rear surface side) of the Y-axis moving plate 62, and a Y-axis ball screw 64 parallel to the Y-axis guide rails 60 is in screw engagement with the nut section. A Y-axis pulse motor (not illustrated) is connected to one end part of the Y-axis ball screw 64. By rotating the Y-axis ball screw 64 by the Y-axis pulse motor, the Y-axis moving plate 62 is moved in the Y-axis direction along the Y-axis guide rails 60.

On a front surface of the Y-axis moving plate 62, a lifting unit 66 that lifts the cutting unit 76 upward and downward along the Z-axis direction (vertical direction) is provided. The lifting unit 66 is provided, on a front surface of the Y-axis moving plate 62, with a pair of Z-axis guide rails 68 along the Z-axis direction. A Z-axis moving plate 70 is slidably attached to the pair of Z-axis guide rails 68. A nut section (not illustrated) is provided on the back surface side (rear surface side) of the Z-axis moving plate 70, and a Z-axis ball screw 72 provided along the direction parallel to the Z-axis guide rails 68 is in screw engagement with the nut section. A Z-axis pulse motor 74 is connected to one end part of the Z-axis ball screw 72, and, by rotating the Z-axis ball screw 72 by the Z-axis pulse motor 74, the Z-axis moving plate 70 is moved in the Z-axis direction along the Z-axis guide rails 68.

The cutting unit 76 is fixed to a lower portion of the Z-axis moving plate 70. At a position adjacent to the cutting unit 76, an imaging unit 76b for imaging the workpiece supported by the holding table 52 and detecting a processing position is provided. The positions in the Y-axis direction of the cutting unit 76 and the imaging unit 76b are controlled by the indexing feeding unit 58, and the positions in the Z-axis direction of the cutting unit 76 and the imaging unit 76b are controlled by the lifting unit 66.

Figure 3:
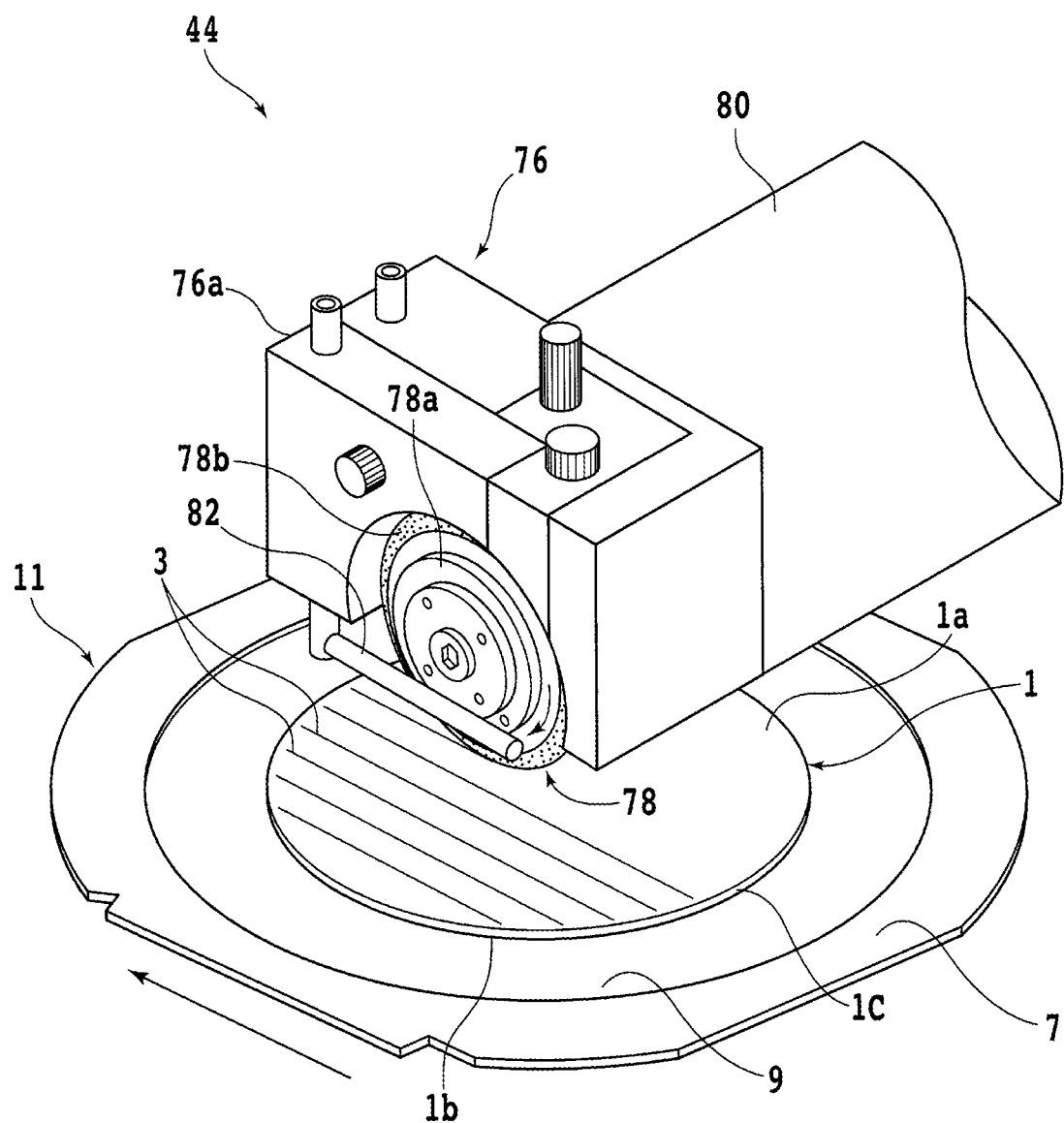
FIG. 3 is a perspective view schematically depicting a first groove forming step.

FIG. 3 includes a perspective view schematically depicting the cutting unit 76. The cutting unit 76 includes a tubular spindle housing 80 that accommodates a spindle with a cutting blade 78 mounted to a tip thereof. The spindle serving as a rotary shaft substantially parallel to the Y-axis is rotatably accommodated in the spindle housing 80. An annular cutting blade 78 is mounted to one end part of the spindle. The cutting blade 78 includes an annular base 78a formed from aluminum or the like, and an annular cutting edge 78b fixed to a peripheral portion of the base 78a. The cutting edge 78b is formed, for example, by fixing abrasive grains of diamond or the like with a binder such as a resin or a metal.

A rotational drive source (not illustrated) such as a motor is connected to the other end side of the spindle, and, when the spindle is rotated by the rotational drive source, the cutting blade 78 is rotated. On one end side of the spindle housing 80, a blade cover 76a that covers the upper side of a peripheral portion of the cutting blade 78 is provided. At a lower end of the blade cover 76a, a pair of nozzles 82 disposed such that the cutting blade 78 is interposed therebetween in the Y-axis direction are provided. At the time of cutting the workpiece, cutting water is supplied to the cutting blade 78 and the workpiece from the pair of nozzles 82. As the cutting water, for example, water (pure water), a liquid with a chemical added to water, or the like is used.

Figure 12:
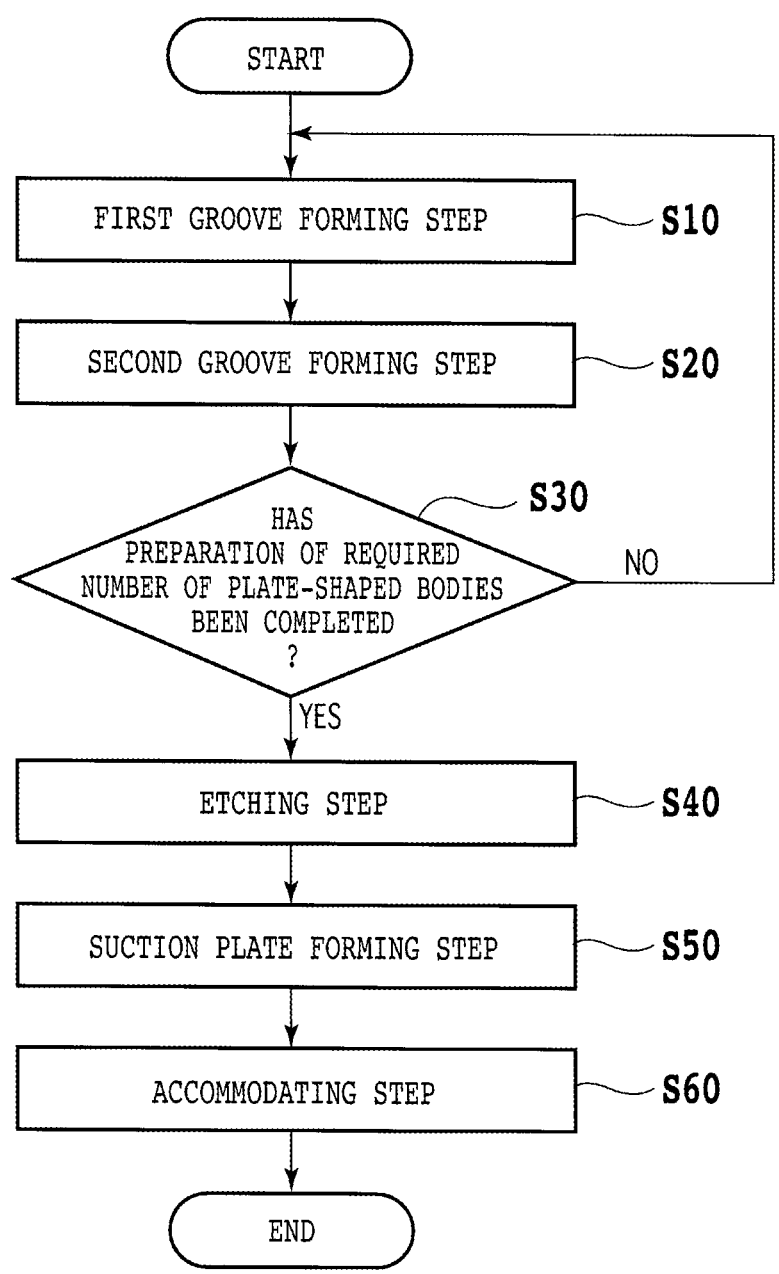
FIG. 12 is a flow chart depicting the flow of steps of the holding table manufacturing method.

Next, the holding table manufacturing method according to the present embodiment will be described. In the manufacturing method, a plate-shaped body of a shape and a material similar to those of the workpiece to be processed by the grinding apparatus 2 is prepared, and this plate-shaped body is processed to form a suction passage causing both sides to communicate with each other. A plurality of plate-shaped bodies formed with the suction passages are united together to form the suction plate 14, and the suction plate 14 is accommodated in the accommodating recess of the frame body 12 to manufacture the holding table. FIG. 12 is a flow chart depicting the flow of steps of the holding table manufacturing method according to the present embodiment. Here, the plate-shaped body serving as a component part of the suction plate 14 will be described. FIG. 3 includes a perspective view schematically depicting the plate-shaped body 1. For example, in a case where a silicon wafer is scheduled to be ground as a workpiece by the grinding apparatus 2, it is recommendable that the plate-shaped body 1 is also a silicon wafer. A first groove forming step S10 and a second groove forming step S20 to be described next are carried out by the cutting apparatus 44.

As depicted in FIG. 3, before the plate-shaped body 1 is conveyed into the cutting apparatus 44, the plate-shaped body 1, an adhesive tape 9, and the annular frame 7 may be united together to form the frame unit 11. In other words, the adhesive tape 9 is attached to the annular frame 7 such as to close the opening of the annular frame 7, and the plate-shaped body 1 is attached to the pressure sensitive adhesive surface of the adhesive tape 9 exposed in the opening. For example, the plate-shaped body 1 is attached to the adhesive tape 9 with the back surface 1b side directed downward, and the front surface 1a side of the plate-shaped body 1 is exposed on the upper side. Then, after the frame unit 11 is formed, the plate-shaped body 1 in the state of the frame unit 11 is conveyed into the cutting apparatus 44, and the plate-shaped body 1 in this state is processed by the cutting apparatus 44. Note that the plate-shaped body 1 may not necessarily be united with the adhesive tape 9 and the annular frame 7.

In the holding table manufacturing method according to the present embodiment, first, the first groove forming step S10 is carried out. The first groove forming step S10 is carried out in the cutting apparatus 44 illustrated in FIG. 2, for example. First, the frame unit 11 including the plate-shaped body 1 is mounted on the porous member 52a of the holding table 52, the annular frame 7 is gripped by the clamps 52b, and the plate-shaped body 1 is held under suction through the adhesive tape 9. Then, the holding table 52 is rotated, to match the processing feeding direction (X-axis direction) of the cutting apparatus 44 and a first direction 13 (see FIG. 4) of the plate-shaped body 1. FIG. 3 is a perspective view schematically depicting the first groove forming step S10. In FIG. 3, the holding table 52 and the like are omitted. As depicted in FIG. 3, in the first groove forming step S10, a plurality of first grooves 3 along one direction are formed in the front surface 1a of the plate-shaped body 1. Here, as depicted in FIG. 3, both ends of each of the first grooves 3 formed on the front surface 1a side of the plate-shaped body 1 in the first groove forming step S10 do not reach side surfaces 1c of the plate-shaped body 1.

Figure 4A:
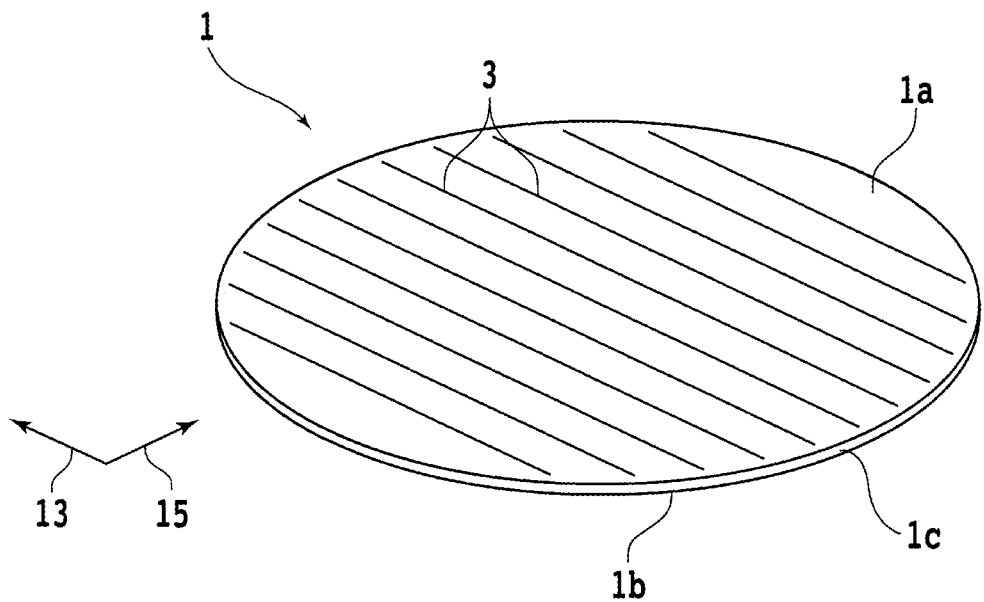
FIG. 4A is a perspective view schematically depicting a front surface side of a plate-shaped body.

At the time of forming the first groove 3 in the plate-shaped body 1, first, the cutting edge 78b of the cutting blade 78 of the cutting unit 76 is positioned on the upper side of one end of the street of the first groove 3 to be formed first. Then, while the cutting blade 78 rotates at a rotational speed of approximately 30,000 rpm, the cutting unit 76 is lowered, to cause the cutting blade 78 to cut into the front surface 1a of the plate-shaped body 1. Thereafter, the plate-shaped body 1 is put to processing feeding, to thereby cut the front surface 1a side of the plate-shaped body 1 by the cutting blade 78 to the other end of the street of the first groove 3. Then, when the cutting blade 78 reaches the other end of the street of the first groove 3, the processing feeding of the plate-shaped body 1 is stopped, and the cutting unit 76 is raised. As a result, the first groove 3 is formed in the front surface 1a of the plate-shaped body 1. Thereafter, the cutting unit 76 is moved to the upper side of one end of the street of the first groove 3 to be formed next, and, similarly, the next first groove 3 is formed in the front surface 1a of the plate-shaped body 1. When this operation is repeated, as depicted in FIG. 4A, a plurality of first grooves 3 along the first direction 13 are formed in the front surface 1a of the plate-shaped body 1.

Here, the depth of the first grooves 3 formed in the first groove forming step S10 is favorably set such that the sum of this depth and the depth of second grooves 5 formed on the back surface 1b side of the plate-shaped body 1 in the second groove forming step S20 to be described next exceeds the thickness of the plate-shaped body 1. Preferably, the depth of the first grooves 3 and the depth of the second grooves 5 each exceed one half the thickness of the plate-shaped body 1. In the first groove forming step S10 and the second groove forming step S20, the lowered position of the cutting unit 76 is controlled such that the first grooves 3 and the second grooves 5 to be formed have predetermined depths.

Figure 4B:
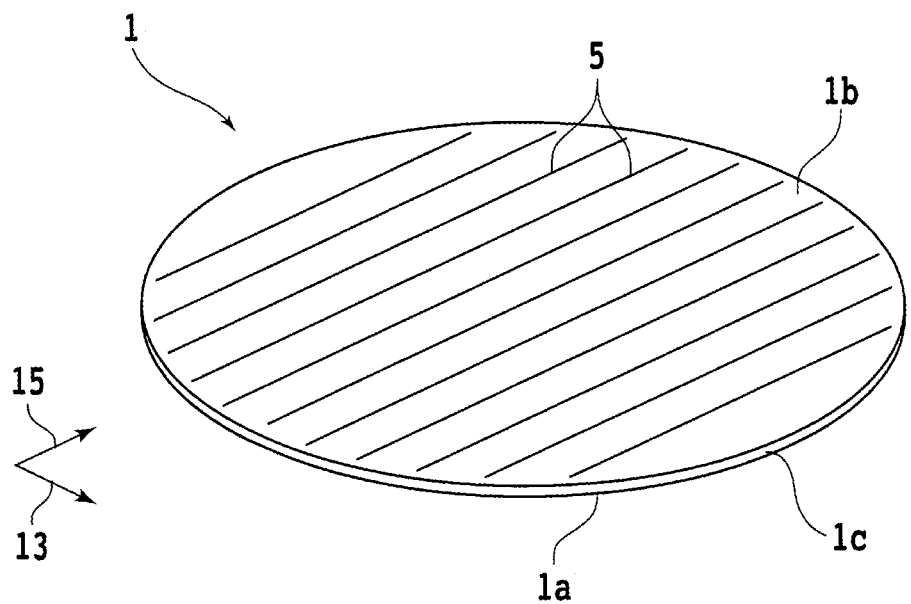
FIG. 4B is a perspective view schematically depicting a back surface side of the plate-shaped body.

Next, the second groove forming step S20 will be described. The second groove forming step S20 is carried out by the cutting apparatus 44, similarly to the first groove forming step S10. FIG. 4B is a perspective view schematically depicting the plate-shaped body 1 formed on the back surface 1b side with a plurality of the second grooves 5 along a second direction 15 in the second groove forming step S20. In the second groove forming step S20, the plate-shaped body 1 is inverted face side back, and the back surface 1b of the plate-shaped body 1 is formed with a plurality of the second grooves 5 along the second direction 15 which intersects the first direction 13. Here, in a case where the plate-shaped body 1 has been incorporated in the frame unit 11 at the time of performing the first groove forming step S10, it is necessary to re-attach the adhesive tape 9. In other words, a new adhesive tape 9 is attached to the front surface 1a side of the plate-shaped body 1, and the old adhesive tape 9 having been attached to the back surface 1b side is peeled off therefrom, to expose the back surface 1b side of the plate-shaped body 1. Thereafter, the newly formed frame unit 11 is mounted on the holding table 52, and the plate-shaped body 1 is held by the holding table 52 under suction through the new adhesive tape 9.

Thereafter, the back surface 1b side of the plate-shaped body 1 is cut by the cutting blade 78 similarly to the first groove forming step S10, to form the back surface 1b of the plate-shaped body 1 with a plurality of the second grooves 5 along the second direction 15 which intersects the first direction 13. Here, the front surface 1a and the back surface 1b of the plate-shaped body 1 are not distinguishable from each other. For example, the surface to be previously formed with the grooves is the front surface 1a, and the surface to be next formed with the grooves is the back surface 1b. The directions of the first direction 13 and the second direction 15 are set such that the first grooves 3 and the second grooves 5 will not be parallel to each other. In each of the drawings, the first direction 13 and the second direction 15 are orthogonal to each other, and the first grooves 3 and the second grooves 5 are orthogonal to each other, but the holding table manufacturing method according to the present embodiment is not limited to this. In other words, it is sufficient that the first direction 13 and the second direction 15 are not parallel to each other, and the first direction 13 and the second direction 15 are set such that intersections of the first grooves 3 and the second grooves 5 are formed in plan view of the plate-shaped body 1.

Figure 5A:
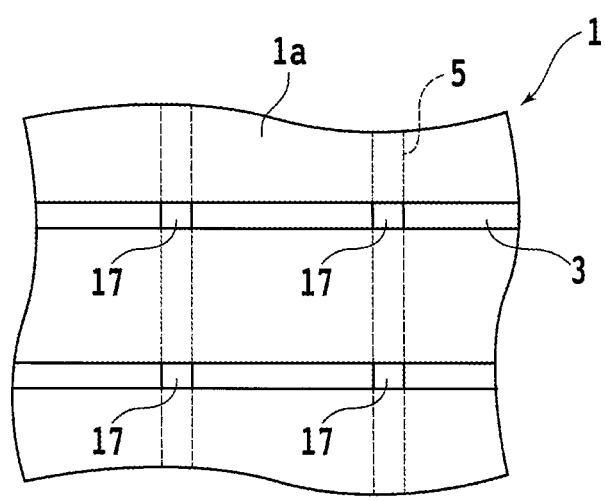
FIG. 5A is a plan view schematically depicting, in enlarged form, a part of the front surface side of the plate-shaped body.
Figure 5B:
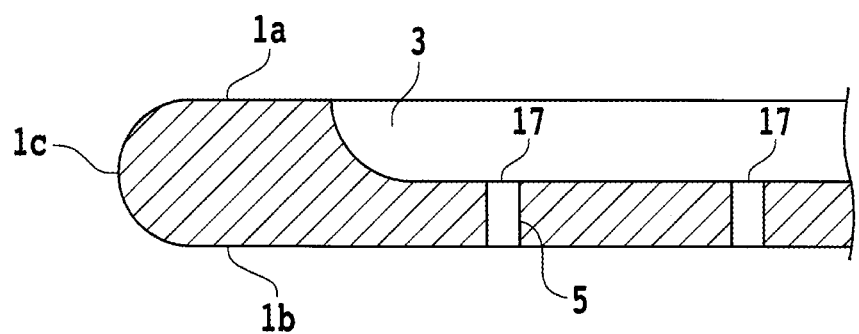
FIG. 5B is a sectional view schematically depicting, in enlarged form, a part of the plate-shaped body.

FIG. 5A is a plan view schematically depicting, in enlarged form, a part on the front surface 1a side of the plate-shaped body 1 formed with the first grooves 3 and the second grooves 5, and FIG. 5B is a sectional view schematically depicting, in enlarged form, a part of the plate-shaped body 1 formed with the first grooves 3 and the second grooves 5. Here, the depth of the second grooves 5 formed in the second groove forming step S20 is as aforementioned. In other words, the depth of the first grooves 3 and the depth of the second grooves 5 are set such that the sum of them is larger than the thickness of the plate-shaped body 1. In this case, at the respective intersections of the first grooves 3 and the second grooves 5, bottom portions of them communicate with each other, to form communicating passages 17 connecting the front surface 1a side and the back surface 1b side of the plate-shaped body 1. Then, on the front surface 1a side and the back surface 1b side of the plate-shaped body 1, a gas can go forward and backward through the communicating passages 17. On the other hand, the first grooves 3 and the second grooves 5 do not reach the side surfaces 1c of the plate-shaped body 1. Therefore, the gas passing through the communicating passages 17 does not leak to the sides of the side surfaces 1c of the plate-shaped body 1.

In addition, the depths of the first grooves 3 and the second grooves 5 are preferably set in consideration of the accuracy and variability in the cutting carried out in the first groove forming step S10 and the second groove forming step S20. For example, in a case where the plate-shaped body 1 is a silicon wafer having a thickness of 780 µm, one half thereof being 390 µm, it is desirable that each of the depths of the first grooves 3 and the second grooves 5 is deeper by the depth on the order of several tens of micrometers than 390 µm. As a result, the first grooves 3 and the second grooves 5 are securely connected to each other at their intersections.

Besides, the widths of the first grooves 3 and the second grooves 5 are favorably equal to or more than 10 µm, and are preferably on the order of several hundreds of micrometers such that the grooves are stably formed in predetermined depths in the plate-shaped body 1. On the widths of the first grooves 3 and the second grooves 5, the thickness of the cutting edge 78b of the cutting blade 78 is reflected. When the cutting blade 78 having the cutting edge 78b having such a thickness that the widths of the first grooves 3 and the second grooves 5 become such a width is used, the first grooves 3 and the second grooves 5 can be formed stably. Further, it is favorable that a plurality of the first grooves 3 and a plurality of the second grooves 5 are formed at regular intervals, and it is favorable that the intervals are 0.5 or more to 10 mm or less. When a plurality of the first grooves 3 and a plurality of the second grooves 5 are formed in the plate-shaped body 1 at regular intervals, the negative pressure to be described later is transmitted uniformly between the front surface 1a and the back surface 1b, in the whole region of the plate-shaped body 1.

Note that the depths and intervals of the first grooves 3 and the second grooves 5 are not limited to these, but are determined, as required, such as to correspond to the kind and size of the workpiece held by the holding table 10 manufactured under suction, the magnitude of the negative pressure desired to act on the workpiece, and the like. In addition, the depths, the intervals, the numbers of pieces, and the like of the first grooves 3 and the second grooves 5 can be selected such as to be performance suitable for the contents of processing conducted by the apparatus into which the holding table 10 is incorporated.

In the holding table manufacturing method according to the present embodiment, a number of plate-shaped bodies 1 formed with a plurality of the first grooves 3 and a plurality of the second grooves 5 are prepared, the number being necessary for forming the suction plate 19 to be described later. In other words, in a case where the required number of plate-shaped bodies 1 have not yet been prepared (S30, see FIG. 12), the first groove forming step S10 and the second groove forming step S20 are repeated, to prepare the required number of plate-shaped bodies 1. In a case where the required number of plate-shaped bodies 1 formed with a plurality of the first grooves 3 and a plurality of the second grooves 5 have been prepared (S30, see FIG. 12), the process proceeds to the next step.

Figure 6A:
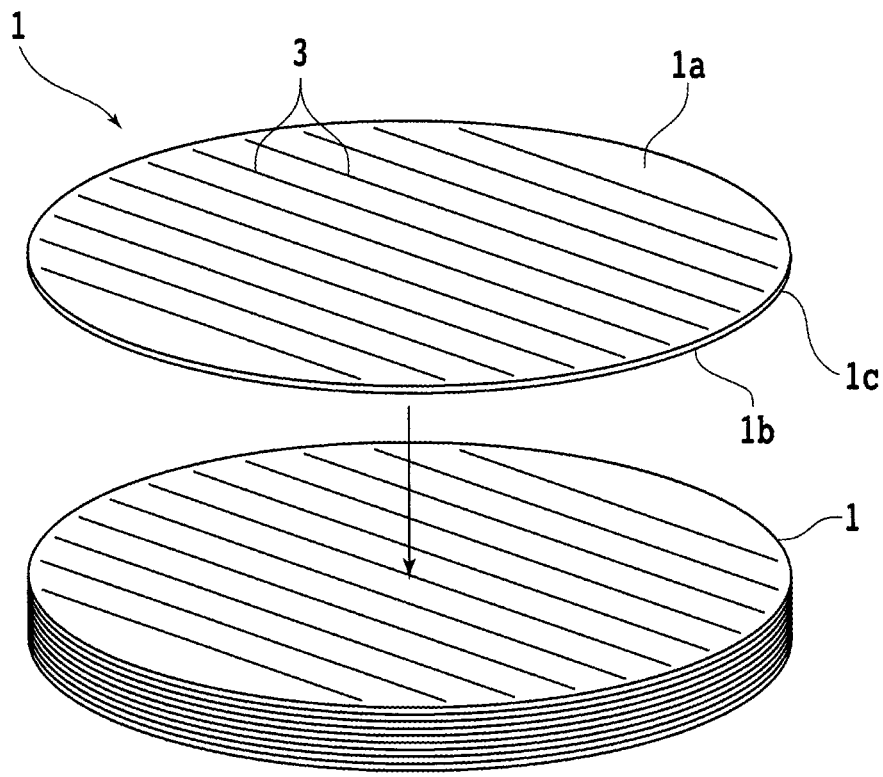
FIG. 6A is a perspective view schematically depicting the manner of laying the plate-shaped bodies on one another.
Figure 6B:
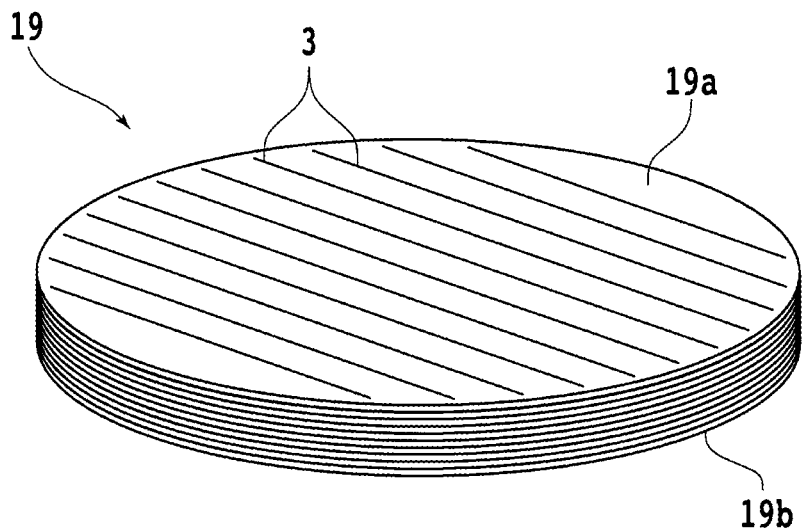
FIG. 6B is a perspective view schematically depicting a suction plate.

Next, a suction plate forming step S50 is carried out in which a plurality of the plate-shaped bodies 1 formed respectively with a plurality of the first grooves 3 and a plurality of the second grooves 5 are laid on one another, and a plurality of the plate-shaped bodies 1 are united together to form a suction plate. FIG. 6A is a perspective view schematically depicting the manner of laying a plurality of the plate-shaped bodies 1 on one another, and FIG. 6B is a perspective view schematically depicting the suction plate 19 formed.

In the suction plate forming step S50, first, a plurality of the plate-shaped bodies 1 are laid on one another. Here, the thickness of the suction plate 19 to be formed can be determined by the number of the plate-shaped bodies 1 laid on one another. The number of the plate-shaped bodies 1 is favorably determined such that the suction plate 19 thicker than the depth of an accommodating recess 86 (see FIG. 8A and the like) of the frame body 12 (see FIG. 8A and the like) to be described later can be formed. In addition, in FIG. 6A, the front surface 1a side of each plate-shaped body 1 is directed upward, while the back surface 1b side is directed downward, and the direction of the first grooves 3 formed in each plate-shaped body 1 and the direction of the second grooves 5 formed in each plate-shaped body 1 are unified. However, the holding table manufacturing method according to the present embodiment is not limited to these. With respect to the formation of the suction plate 19, the performance of the plate-shaped bodies 1 is not varied depending on the directions of the front surface 1a side and the back surface 1b side, and the performance of the plate-shaped bodies 1 is not varied depending on the directions of the first grooves 3 and the second grooves 5. Therefore, the direction of each plate-shaped body 1 is not necessary to be particularly controlled.

In the suction plate forming step S50, a plurality of the plate-shaped bodies 1 are laid on one another, and thereafter a plurality of the plate-shaped bodies 1 are united together. A plurality of the plate-shaped bodies 1 can be united together, for example, by a direct bonding technique. Before laying a plurality of the plate-shaped bodies 1 on one another, a chemical such as an acid is made to act on the front surface 1a and the back surface 1b of each plate-shaped body 1, to form a thin oxide film on the front surface 1a and the back surface 1b and to provide exposed hydroxyl groups there. Next, when one plate-shaped body 1 is laid on another plate-shaped body 1, both of them are bonded to each other. This is considered to be because a hydrogen bond is formed between the hydroxyl groups provided on the facing surfaces of both of the plate-shaped bodies 1. Then, when the laminate of a plurality of the plate-shaped bodies 1 bonded is heated to a temperature of equal to or higher than 400° C., molecules of water are released from the bonding surfaces, and each plate-shaped body 1 is bonded more strongly. Particularly, when the laminate of a plurality of the plate-shaped bodies 1 is heated to a temperature on the order of 1,000° C., each plate-shaped body 1 is bonded to an extent similar to the bonds (covalent bond between atoms, or the like) contained in the material (silicon or the like) constituting each plate-shaped body 1.

Further, a plurality of the plate-shaped bodies 1 may be united together by a method which does not need heating. For example, two plate-shaped bodies 1 to be united together are introduced into a vacuum chamber, and the respective surfaces, which are to be bonded, of the plate-shaped bodies 1 are subjected to a surface treatment in the vacuum chamber. This surface treatment may be, for example, sputtering in which irradiation with argon ions is conducted, and is a treatment for activating the atoms constituting the outer surface of the plate-shaped body 1 to enhance reactivity. Thereafter, when the two plate-shaped bodies 1 are brought into contact with each other in the vacuum chamber, bonds are formed between the atoms constituting the outer surfaces of the plate-shaped bodies 1, whereby the plate-shaped bodies 1 are strongly bonded to each other. Then, when bonding of the plate-shaped bodies 1 is repeated in the vacuum chamber, the suction plate 19 can be formed. Note that the suction plate forming step S50 is not limited to this, but can be carried out by various known methods such as thermocompression bonding. It is to be noted, however, that, in a case of bonding a plurality of the plate-shaped bodies 1 to unite them together, it is necessary for each plate-shaped body 1 to have surfaces extremely high in flatness.

When the suction plate forming step S50 is carried out, the suction plate 19 in which a plurality of the plate-shaped bodies 1 are united together is formed. In this instance, the first grooves 3 or the second grooves 5 of each plate-shaped body 1 are connected to the first grooves 3 or the second grooves 5 of the adjacent other plate-shaped body 1. Therefore, the front surface 19a side and the back surface 19b side of the suction plate 19 communicate with each other.

Note that, in the periphery of the first grooves 3 and the second grooves 5 formed by performing the first groove forming step S10 and the second groove forming step S20, minute cracks called micro-cracks or damage called chipping is generated in the plate-shaped body 1. In view of this, it is favorable to perform an etching step S40, before uniting together a plurality of the plate-shaped bodies 1 by performing the suction plate forming step S50. The etching step S40 is favorably carried out after the first groove forming step S10 and the second groove forming step S20 are conducted and before the suction plate forming step S50 is performed. In the etching step S40, for example, the plate-shaped body 1 is treated with a mixed liquid of nitric acid and hydrofluoric acid, or the like. As a result, damages such as microcracks and chipping are removed from the plate-shaped body 1. In this case, the strength of each plate-shaped body 1 is enhanced, and the strength of the suction plate 19 to be formed subsequently is also enhanced. In addition, the outer surfaces of each plate-shaped body 1 are cleaned, and the bonding of a plurality of the plate-shaped bodies 1 is facilitated.

Figure 8A:
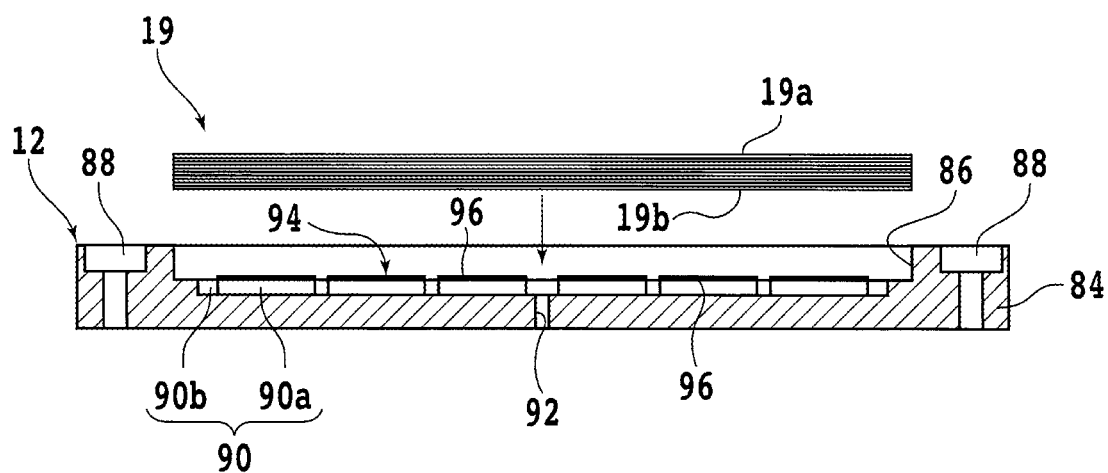
FIG. 8A is a sectional view schematically depicting an accommodating step.

In the holding table manufacturing method according to the present embodiment, an accommodating step S60 is carried out after the etching step S40 and the suction plate forming step S50 are performed. FIG. 8A is a sectional view schematically depicting the accommodating step S60. In the accommodating step S60, the suction plate 19 is accommodated in the accommodating recess 86 of the frame body 12 formed with the accommodating recess 86 in an upper surface thereof, to form the holding table 10.

Figure 7:
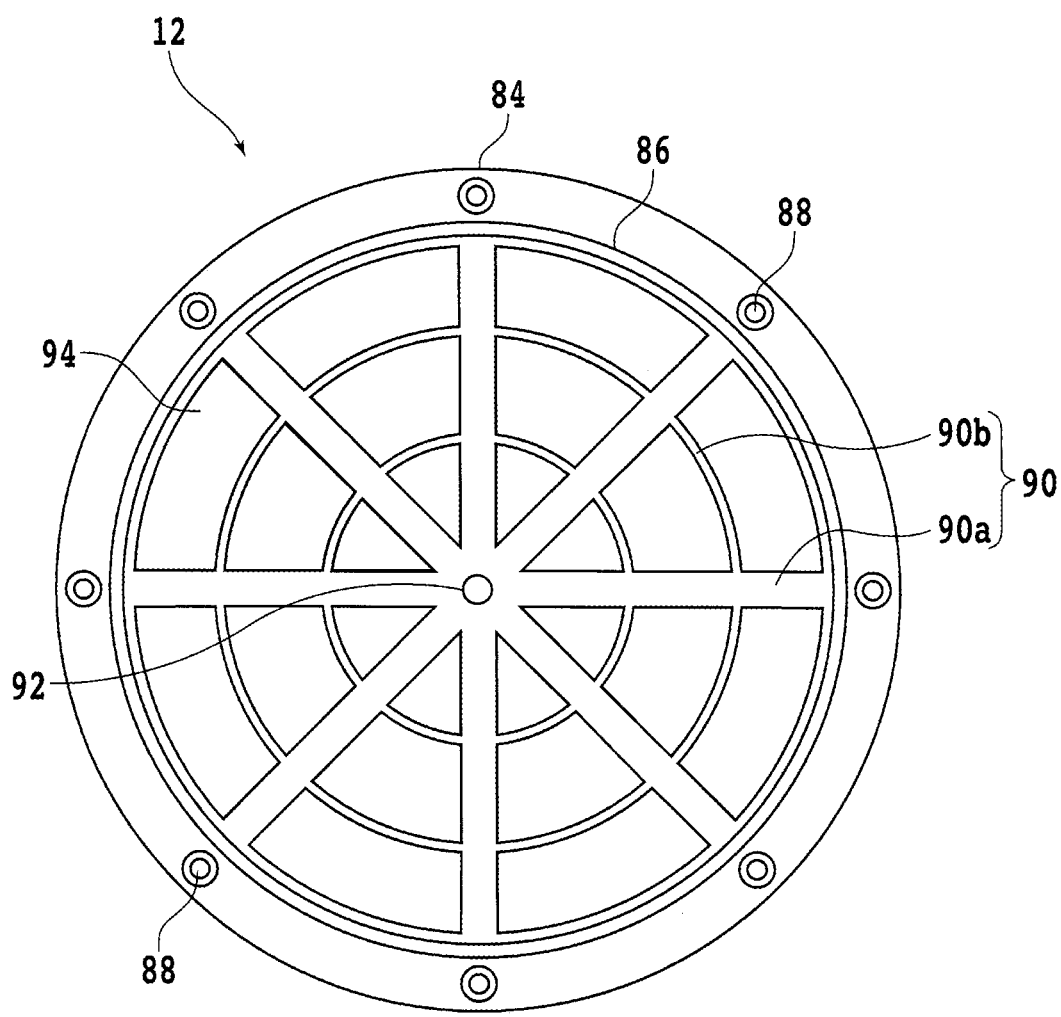
FIG. 7 is a plan view schematically depicting a frame body.
Figure 8B:
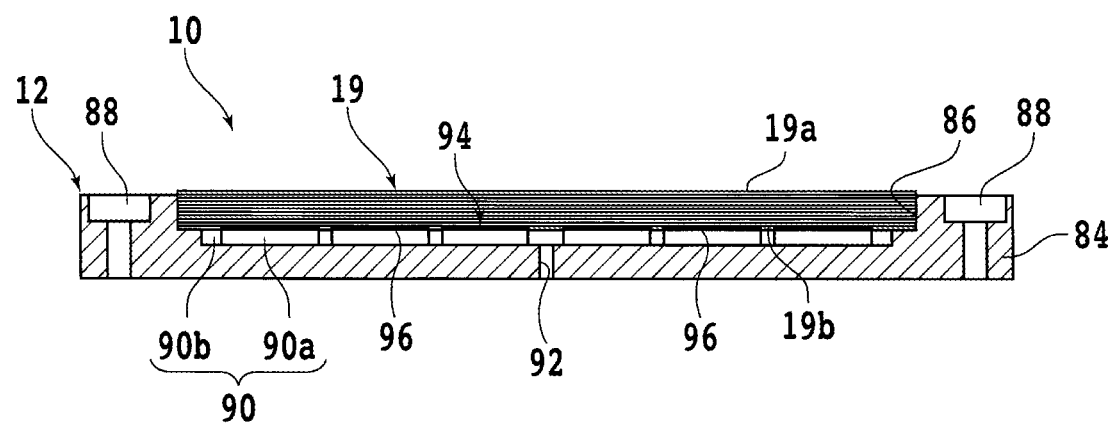
FIG. 8B is a sectional view schematically depicting a manufactured holding table.

Here, the frame body 12 that accommodates the suction plate 19 in the accommodating step S60 will be described. FIG. 7 is a plan view schematically depicting the frame body 12. In addition, FIGS. 8A and 8B include sectional views schematically depicting the frame body 12. The frame body 12 is, for example, a disk-shaped member formed from a material such as stainless steel or a ceramic. The upper surface of the frame body 12 is formed with the accommodating recess 86 capable of accommodating the suction plate 19. The accommodating recess 86 has a shape corresponding to the shapes of the suction plate 19 and the plate-shaped body 1. For example, in a case where the plate-shaped body 1 is disk-like in shape, the accommodating recess 86 is formed in a circular region having a diameter slightly larger than the diameter of the plate-shaped body 1. A bottom portion of the accommodating recess 86 is formed with suction grooves 90, and a suction passage 92 communicating with the back surface side (lower surface side) of the frame body 12. The suction grooves 90 include, for example, a plurality of radial grooves 90a, and a plurality of annular grooves 90b. The radial grooves 90a and the annular grooves 90b communicate with the suction passage 92. In addition, the main region of a bottom portion of the accommodating recess 86 which is not the suction grooves 90 is a flat surface 94 having a unified height. As will be described later, the flat surface 94 serves as a support surface for supporting the suction plate 19.

Note that the configurations of the radial grooves 90a and the annular grooves 90b of the suction grooves 90 are not particularly limited, and it is unnecessary for the suction grooves 90 to include the radial grooves 90a and the annular grooves 90b. It is favorable that the suction grooves 90 are determined in configuration such that a negative pressure can be uniformly transmitted thereby to the back surface 19b of the suction plate 19 as will be described later. In addition, it is favorable that the shape of the suction grooves 90 is determined such that the flat surface 94 for supporting the suction plate 19 can be secured in a sufficient area.

The frame body 12 is formed, on the outside of the accommodating recess 86, with a plurality of through-holes 88 into which fixtures such as bolts for fixing the holding table 10 to be manufactured by the holding table manufacturing method according to the present embodiment to a base (not illustrated) of the processing apparatus or the like that serves as a fixing destination are fastened.

When a disk-shaped porous member is accommodated in the accommodating recess 86 of the frame body 12, a conventional holding table can be manufactured, and the holding table 10 manufactured by the holding table manufacturing method according to the present embodiment can be manufactured by diverting the frame body 12 which has been used for accommodating the porous member in the conventional holding table. In other words, the frame body 12 may not necessarily be exclusive goods for accommodating the suction plate 19. In a case where the conventional frame body 12 is utilized, the number of the plate-shaped bodies 1 constituting the suction plate 19 is determined for forming the suction plate 19 in a thickness which is larger than the depth of the accommodating recess 86.

In the accommodating step S60, the suction plate 19 is accommodated in the accommodating recess 86 of the frame body 12. It is favorable that, in order to fix the suction plate 19 to the frame body 12, an adhesive 96 is preliminarily applied to the back surface 19b side of the suction plate 19 or the flat surface 94 at the bottom portion of the accommodating recess 86 of the frame body 12. When the suction plate 19 is accommodated in the accommodating recess 86 and is fixed to the frame body 12, the holding table 10 can be manufactured. In this instance, an upper portion of the suction plate 19 is exposed on the outside of the accommodating recess 86, and the front surface 19a of the suction plate 19 is higher than the upper surface of the frame body 12.

The grooves (second grooves 5) formed on the lower surface (back surface 1b) side of the plate-shaped body 1 disposed on the back surface 19b of the suction plate 19 is connected to the suction grooves 90 of the frame body 12. Then, the suction passage 92 of the frame body 12 and the front surface 19a of the suction plate 19 are made to communicate with each other through the first grooves 3 and the second grooves 5 of each plate-shaped body 1 constituting the suction plate 19 and the suction grooves 90. In other words, when a suction source (not illustrated) is connected to the lower end of the suction passage 92, a negative pressure is transmitted to the front surface 19a of the suction plate 19. In this instance, since other passages are closed, the negative pressure is not liable to leak.

The holding table 10 manufactured by carrying out the accommodating step S60 can be incorporated into a processing apparatus such as the grinding apparatus 2 depicted in FIG. 1. The grinding apparatus 2 includes a base (not illustrated) that supports the holding table 10. When the holding table 10 is mounted on the base and fixtures such as bolts are passed through the through-holes 88 and the bolts are fastened to fixing holes formed in the base, the holding table 10 can be fixed to the base of the grinding apparatus 2. In this instance, the lower end of the suction passage 92 of the frame body 12 is connected to the suction source (not illustrated) of the grinding apparatus 2.

In the grinding apparatus 2, self-grinding in which the upper surface of the holding table 10 is ground by the grindstones 42 is conducted before a silicon wafer or the like serving as the workpiece is mounted on the holding table 10. In this instance, since the suction plate 19 formed from a material similar to the material of the workpiece is projected at the upper surface of the holding table 10, the grindstones 42 grind the suction plate 19. Therefore, the same grindstones 42 can be used when conducting the self-grinding and when grinding the workpiece, so that exchange of the grinding wheel 40 is not needed.

Here, although it is contemplated that the porous member having been used in the conventional holding table 10 is formed from a material similar to the material of the workpiece, a complicated manufacturing process for forming the porous member is needed. On the other hand, in the holding table manufacturing method according to the present embodiment, a plurality of the plate-shaped bodies 1 formed from a material similar to the material of the workpiece are united together to manufacture the suction plate 19 and the suction plate 19 is accommodated in the frame body 12 similarly to the conventional technology, whereby the holding table 10 can be easily formed. Particularly, instead of forming deep grooves to be connected mutually in the front and back surfaces of a plate-shaped body of a thickness similar to the thickness of the suction plate 19, comparatively shallow grooves are formed in a plate-shaped body 1 thinner than the suction plate 19, and a plurality of plate-shaped bodies 1 are united together to form the suction plate 19. The first grooves 3 and the second grooves 5 which are comparatively shallow can be formed easily and stably. As aforementioned, according to the holding table manufacturing method of the present embodiment, it is possible to stably and easily manufacture the holding table 10 that enables self-grinding to be performed efficiently by use of the grindstones 42 for grinding the workpiece.

Note that the present invention is not limited to the description of the above embodiment and can be carried out with various modifications. For example, a case where the plate-shaped bodies 1 constituting the suction plate 19 are formed from the same material as the workpiece held by the holding table 10 has been described in the above embodiment, but the plate-shaped bodies 1 may not necessarily be formed from strictly the same material as the workpiece. It is sufficient that the same grindstones 42 can be used when performing the self-grinding and when grinding the workpiece. In other words, the plate-shaped bodies 1 may be formed from any material that can be ground by the grindstones 42 capable of grinding the workpiece.

Figure 9:
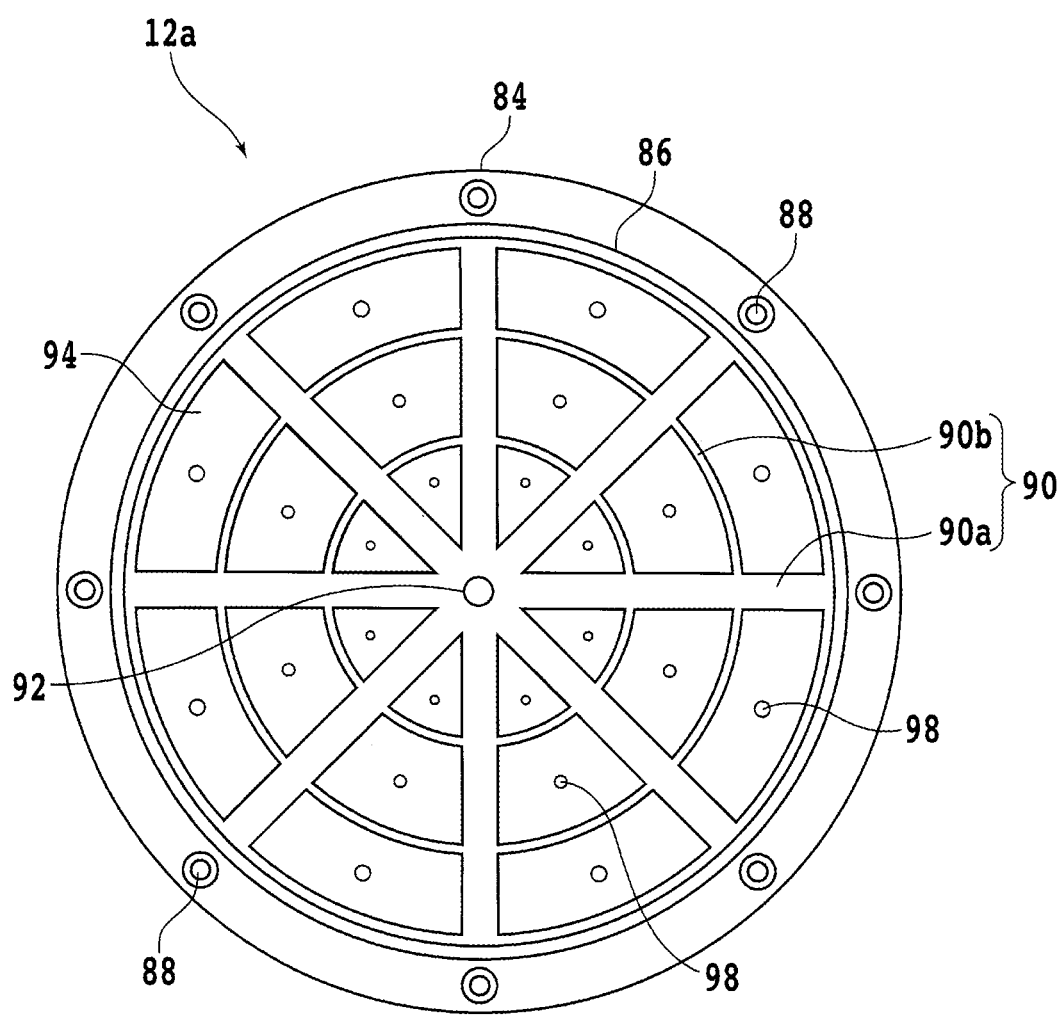
FIG. 9 is a plan view schematically depicting a modification example of the frame body.
Figure 10A:
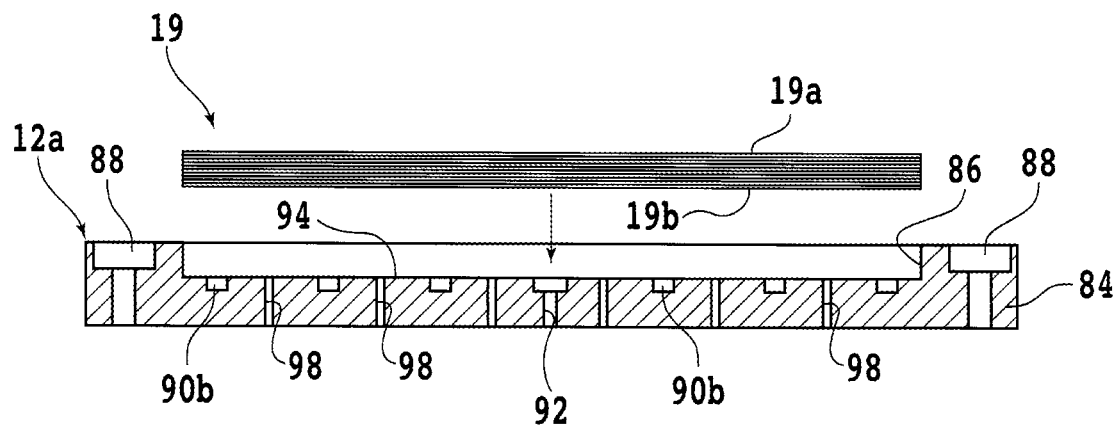
FIG. 10A is a sectional view schematically depicting the accommodating step.

In addition, a case where the suction plate 19 is fixed to the frame body 12 with the adhesive 96 in the accommodating step S60 has been described in the above embodiment, but one mode of the present invention is not limited to this. In other words, the suction plate 19 may be fixed to the frame body 12 by other methods. FIG. 9 is a plan view schematically depicting a frame body 12*a* to which the suction plate 19 can be fixed by another method, and FIG. 10A is a sectional view schematically depicting the manner of accommodating the suction plate 19 in the frame body 12 in the accommodating step S60. The frame body 12*a*, unlike the frame body 12 depicted in FIG. 7 and the like, is formed with a plurality of plate suction passages 98 communicating with the flat surface 94. The plate suction passages 98 are independent from the suction grooves 90 and the suction passage 92. Each of the plate suction passages 98 communicates with the lower surface of the frame body 12. Alternatively, the plate suction passages 98 join one another in the inside of the frame body 12*a* and communicate with the lower surface of the frame body 12.

Figure 10B:
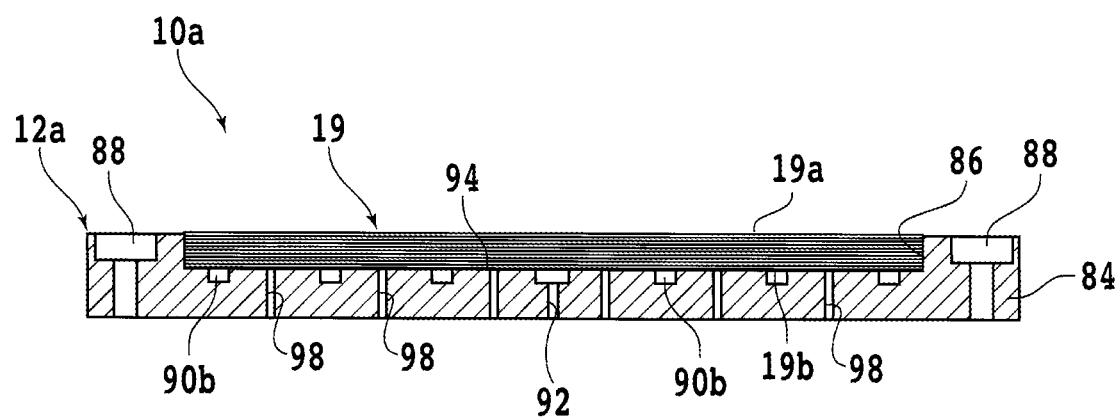
FIG. 10B is a sectional view schematically depicting a manufactured holding table.

FIG. 10B is a sectional view schematically depicting a holding table 10*a* manufactured in the accommodating step S60. In the accommodating step S60, the holding table 10*a* is formed by accommodating the suction plate 19 in the accommodating recess 86 of the frame body 12*a*. The suction plate 19 is supported by the flat surface 94. Another suction source (suction passage) capable of being controlled independently from the suction source (suction passage) connected to the suction passage 92 is connected to the processing apparatus such as the grinding apparatus 2 into which the holding table 10*a* is incorporated. Then, by sucking the suction plate 19 by the other suction source or the like through the plate suction passages 98, the suction plate 19 can be fixed to the frame body 12*a*. Therefore, in the accommodating step S60, the suction plate 19 does not need to be fixed to the frame body 12*a*. In this case, only the suction plate 19 can be exchanged while fixing the frame body 12*a* to the processing apparatus such as the grinding apparatus 2.

Figure 11:
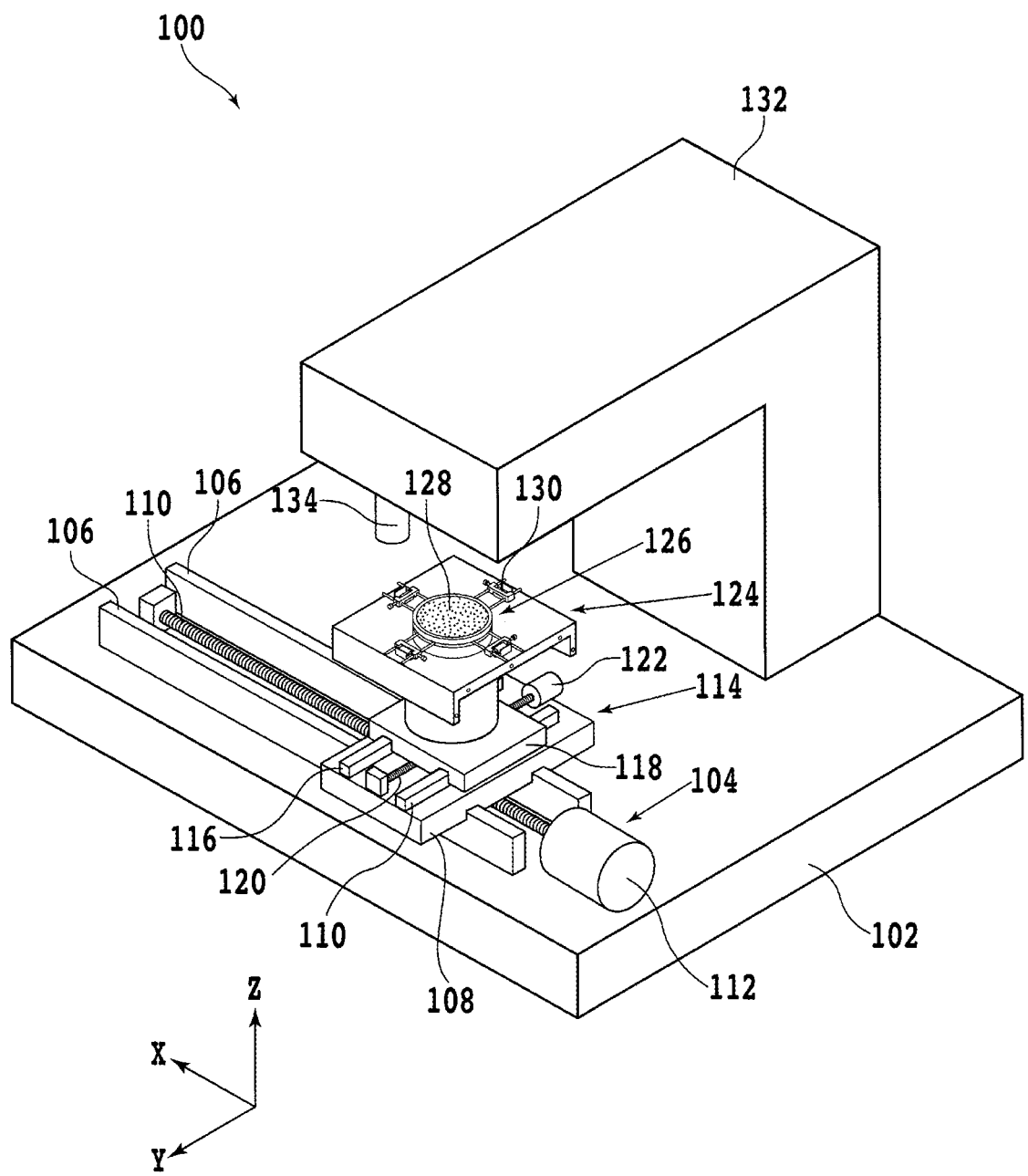
FIG. 11 is a perspective view schematically depicting a laser processing apparatus.

In addition, a case where the first groove forming step S10 and the second groove forming step S20 are carried out using the cutting apparatus 44 (see FIG. 2) has been described in the above embodiment. In other words, a case where the first grooves 3 are formed by cutting the front surface 1*a* side of the plate-shaped body 1 by the annular cutting blade 78 and the second grooves 5 are formed by cutting the back surface 1*b* side of the plate-shaped body 1 by the cutting blade 78 has been described. However, one mode of the present invention is not limited to this, and the first grooves 3 and the second grooves 5 may be formed in the plate-shaped body 1 by other methods. FIG. 11 is a perspective view schematically depicting a laser processing apparatus 100 capable of forming the first grooves 3 and the second grooves 5 by ablation by applying a laser beam to the plate-shaped body 1. In other words, in the first groove forming step S10, a laser beam of such a wavelength as to be absorbed in the plate-shaped body 1 may be applied to the front surface 1*a* side of the plate-shaped body 1 to form the first grooves 3 by ablation. In addition, in the second groove forming step S20, the laser beam may be applied to the back surface 1*b* side of the plate-shaped body 1 to form the second grooves 5 by ablation.

Here, the laser processing apparatus 100 will be described. The laser processing apparatus 100 includes a base 102 that supports constituent elements. An X-axis direction moving unit 104 that moves a holding table 126 holding the plate-shaped body 1 in the X-axis direction and a Y-axis direction moving unit 114 that moves the holding table 126 in the Y-axis direction orthogonal to the X-axis direction are provided on an upper surface of the base 102.

The X-axis direction moving unit 104 includes a pair of X-axis guide rails 106 along the X-axis direction on the upper surface of the base 102. An X-axis moving table 108 is slidably attached to the pair of X-axis guide rails 106. A nut section (not illustrated) is provided on the back surface side of the X-axis moving table 108, and an X-axis ball screw 110 substantially parallel to the X-axis guide rails 106 is in screw engagement with the nut section. An X-axis pulse motor 112 is connected to one end part of the X-axis ball screw 110. With the X-axis ball screw 110 rotated by the X-axis pulse motor 112, the X-axis moving table 108 is moved in the X-axis direction along the X-axis guide rails 106.

The Y-axis direction moving unit 114 includes, on an upper surface of the X-axis moving table 108, a pair of Y-axis guide rails 116 along the Y-axis direction. A Y-axis moving table 118 is slidably attached to the pair of the Y-axis guide rails 116. A nut section (not illustrated) is provided on the back surface side of the Y-axis moving table 118, and a Y-axis ball screw 120 substantially parallel to the Y-axis guide rails 116 is in screw engagement with the nut section. A Y-axis pulse motor 122 is connected to one end part of the Y-axis ball screw 120. With the Y-axis ball screw 120 rotated by the Y-axis pulse motor 122, the Y-axis moving table 118 is moved in the Y-axis direction along the Y-axis guide rails 116. A cover 124 and a holding table 126 that holds the plate-shaped body 1 are provided on an upper surface of the Y-axis moving table 118.

In the periphery of the holding table 126, a plurality of clamps 130 that grips the annular frame 7 of the frame unit 11 are provided. The holding table 126 includes a porous member 128 exposed on the upper surface, a suction passage connected at one end to the porous member 128, and a suction source connected to the other end of the suction passage. When the suction source is operated, the plate-shaped body 1 mounted on the holding table 126 is held under suction.

On an upper side of the holding table 126, a laser beam applying unit 134 capable of applying a laser beam to the plate-shaped body 1 held by the holding table 126 under suction is provided. The laser beam applying unit 134 is supported by a support section 132 that supports a column section extending upward from a rear upper surface of the base 102, and an arm section extending to the upper side of the holding table 126 from an upper end of the column section. The laser beam applying unit 134 includes a laser oscillator (not illustrated) that can emit a laser beam of such a wavelength as to be absorbed in the plate-shaped body 1 (a wavelength which the plate-shaped body 1 absorbs), and a condenser lens (not illustrated) that can concentrate the laser beam onto the upper surface of the plate-shaped body 1.

In the first groove forming step S10, the frame unit 11 including the plate-shaped body 1 is held by the holding table 126. Then, while moving the holding table 126 in the X-axis direction or the Y-axis direction, a laser beam is applied from the laser beam applying unit 134 to the front surface 1a of the plate-shaped body 1. More in detail, the laser beam is concentrated on the front surface 1a from one end to the other end of the street of the first groove 3, thereby subjecting the plate-shaped body 1 to ablation. As a result, the first groove 3 can be formed. Note that, in a case where a first groove 3 of a sufficient depth cannot be formed by one-time application of the laser beam, the laser beam is further applied to the formed first groove 3 to perform ablation multiple times, thereby deepening the first groove 3. In this way, the first grooves 3 can be formed in the front surface 1a of the plate-shaped body 1. Then, similarly, the second groove forming step S20 is conducted, whereby the second grooves 5 can be formed in the back surface 1b of the plate-shaped body 1.

In this way, in the holding table manufacturing method according to one mode of the present invention, the first grooves 3 and the second grooves 5 may be formed by a method other than cutting by the cutting apparatus 44, and the first grooves 3 and the second grooves 5 may be formed by ablation by the laser processing apparatus 100.

In addition, a case where a plurality of the first grooves 3 are formed in the front surface 1a of the plate-shaped body 1 at regular intervals and a plurality of the second grooves 5 are formed in the back surface 1b of the plate-shaped body 1 at regular intervals has been mainly described in the above embodiment, one mode of the present invention is not limited to this. In other words, a plurality of the first grooves 3 and a plurality of the second grooves 5 may not necessarily be formed in the plate-shaped body 1 at regular intervals.

Properties of each plate-shaped body 1 may be varied depending on the forming positions, the numbers of pieces, and the forming densities of a plurality of the first grooves 3 and a plurality of the second grooves 5 in the plate-shaped body 1, and properties of the suction plate 19 configured by a plurality of the plate-shaped bodies 1 may be varied. For example, when the manufactured holding table 10 is incorporated in the grinding apparatus 2 and self-grinding is conducted to grind the front surface 19a of the suction plate 19, grinding may progress more easily in a central part of the suction plate 19 when the first grooves 3 and the second grooves 5 are formed at regular intervals. In a case where ease of progress of grinding varies depending on the position on the suction plate 19, the front surface 19a of the suction plate 19 and the bottom surfaces of the grindstones 42 rotated and moved do not become parallel to each other even if self-grinding is performed. As a result, the purpose of the self-grinding is not achieved. In view of this, it may be contemplated to adjust the properties of each plate-shaped body 1 by adjusting the forming positions, the numbers of pieces, and the forming densities of a plurality of the first grooves 3 and a plurality of the second grooves 5 such that the front surface 19a of the suction plate 19 and the bottom surfaces of the grindstones 42 rotated and moved become parallel to each other when self-grinding is performed.

For example, one of or both the interval of a plurality of the first grooves 3 and the interval of a plurality of the second grooves 5 are not constant, but the grooves are formed in the plate-shaped body 1 such that the interval of the grooves becomes narrow as they are spaced farther from the center of the plate-shaped body 1. In this case, the ease of progress of grinding is reduced in the center of the suction plate 19, and the front surface 19a of the suction plate 19 and the bottom surfaces of the grindstone 42 become parallel to each other when self-grinding is performed by the grinding apparatus 2. In other words, the purpose of the self-grinding can be achieved. In this way, the properties of the suction plate 19 can be controlled by the forming positions of the first grooves 3 and the second grooves 5, and the like.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A holding table manufacturing method comprising: a first groove forming step of forming a plurality of first grooves in a front surface of a plate-shaped body along a first direction; a second groove forming step of inverting the plate-shaped body face side back and forming a plurality of second grooves in a back surface of the plate-shaped body along a second direction intersecting the first direction; a suction plate forming step of laying, on one another, a plurality of the plate-shaped bodies formed respectively with a plurality of the first grooves and a plurality of the second grooves and uniting the plurality of the plate-shaped bodies together to form a suction plate; and an accommodating step of accommodating the suction plate in an accommodating recess of a frame body formed with the accommodating recess in an upper surface to form a holding table, wherein the first grooves and the second grooves do not reach side surfaces of the plate-shaped body, a sum of a depth of the first grooves and a depth of the second grooves is larger than a thickness of the plate-shaped body, and the first grooves and the second grooves communicate with each other at their intersections, and a thickness of the suction plate is larger than a depth of the accommodating recess.

2. The holding table manufacturing method according to claim 1, wherein, in the first groove forming step, a side of the front surface of the plate-shaped body is cut by an annular cutting blade to form the first grooves, and, in the second groove forming step, a side of the back surface of the plate-shaped body is cut by the cutting blade to form the second grooves.

3. The holding table manufacturing method according to claim 1, wherein, in the first groove forming step, a laser beam of such a wavelength as to be absorbed in the plate-shaped body is applied to a side of the front surface of the plate-shaped body to form the first grooves by ablation, and, in the second groove forming step, the laser beam is applied to a side of the back surface of the plate-shaped body to form the second grooves by ablation.

4. The holding table manufacturing method according to claim 1, wherein, in the accommodating step, the suction plate is fixed to the accommodating recess of the frame body with an adhesive.

5. The holding table manufacturing method according to claim 1, further comprising:

an etching step of etching a side of the front surface and a side of the back surface of a plurality of the plate-shaped bodies before the suction plate forming step.

6. The holding table manufacturing method according to claim 1, wherein the plate-shaped body is formed from a same material as a workpiece to be held by the holding table.

7. The holding table manufacturing method according to claim 1, wherein one of or both an interval of a plurality of the first grooves and an interval of a plurality of the second grooves become narrow as they are spaced farther from a center of the plate-shaped body.

* * * * *